(12) United States Patent
Bousseksou et al.

(10) Patent No.: US 7,638,831 B2
(45) Date of Patent: Dec. 29, 2009

(54) MOLECULAR MEMORY AND METHOD FOR MAKING SAME

(75) Inventors: Azzedine Bousseksou, Toulouse (FR); Christophe Vieu, Ramonville-Saint-Agne (FR); Jean-Francois Letard, Canéjan (FR); Philippe Demont, Toulouse (FR); Jean-Pierre Tuchagues, Ramonville-Saint-Agne (FR); Laurent Malaquin, Villefranche-de-Rouergue (FR); Jerôme Menegotto, Toulouse (FR); Lionel Salmon, Carcassonne (FR)

(73) Assignee: Centre National de la Recherche Scientifique - CNRS (FR)

( * ) Notice: Subject to any disclaimer, the term of this patent is extended or adjusted under 35 U.S.C. 154(b) by 216 days.

(21) Appl. No.: 10/487,796

(22) PCT Filed: Aug. 29, 2002

(86) PCT No.: PCT/FR02/02961

§ 371 (c)(1),
(2), (4) Date: Jul. 12, 2004

(87) PCT Pub. No.: WO03/019695

PCT Pub. Date: Mar. 6, 2003

(65) Prior Publication Data

US 2005/0161728 A1    Jul. 28, 2005

(30) Foreign Application Priority Data

Aug. 31, 2001   (FR) .................................. 01 11328

(51) Int. Cl.
*H01L 21/02* (2006.01)
*H01L 51/30* (2006.01)
*G11C 13/02* (2006.01)

(52) U.S. Cl. .............................. 257/310; 257/E21.008; 257/E51.023; 438/190; 365/151; 977/933

(58) Field of Classification Search ................. 365/151, 365/149; 977/855, 856, 933; 257/532, E29.17, 257/310, E21.008, E21.01, E51.023; 438/3, 438/190
See application file for complete search history.

(56) References Cited

U.S. PATENT DOCUMENTS 5,582,900 A  *  12/1996  Khan et al. ............... 428/195.1
(Continued)

FOREIGN PATENT DOCUMENTS

EP           0 666 561 A     8/1995
(Continued)

OTHER PUBLICATIONS

O. Kahn, et al.; "Spin-Transition Polymers: From Molecular Materials Toward Memory Devices", Science, vol. 279 .44-48 Jan. 2, 1998.*

(Continued)

*Primary Examiner*—Lynne A. Gurley
*Assistant Examiner*—Colleen A Matthews
(74) *Attorney, Agent, or Firm*—DLA Piper LLP (US)

(57) ABSTRACT

A molecular memory including a substrate made of silicon; a set of condensers, each condenser including two conductive layers constituting armatures of the condensers and between which is placed a dielectric layer; and a connector to provide electric contacts with external circuits, wherein the dielectric layer comprises at least partially a polymer containing triazole derivatives, a spin transition phenomenon support material or a spin transition molecular complex; and a method for manufacturing a molecular memory including covering a substrate with a conductive layer; coating a dielectric material on the conductive layer; covering the dielectric material with the conductive layer; impregnating by immersion a buffer in an inking solution of hexadecanethiol; drying and washing the impregnated buffer; creating a protective monolayer on the conductive layer by application of the impregnated, dried and washed buffer; and creating a chemical etching on the sample.

18 Claims, 2 Drawing Sheets

U.S. PATENT DOCUMENTS

| | | | |
|---|---|---|---|
| 6,255,026 B1* | 7/2001 | Kahn et al. | 430/19 |
| 6,272,038 B1* | 8/2001 | Clausen et al. | 365/151 |
| 6,326,216 B1* | 12/2001 | Kato et al. | 438/3 |
| 6,773,632 B1* | 8/2004 | Marshall et al. | 252/500 |

FOREIGN PATENT DOCUMENTS

| | | |
|---|---|---|
| JP | 11 283880 A | 10/1999 |
| WO | 03/022003 A1 | 3/2003 |
| WO | 2007/107644 A1 | 9/2007 |

OTHER PUBLICATIONS

E. Smit et al., *The spin-transition complexes 'Fe(Htrz)3!(C104)2 and 'Fe(NH2trz)3!(C104)2 1, FT-IR spectra of a low pressure and a low temperature phase transition*, Materials Research Bulletin, Elsevier Science Publishing, New York, US, vol. 35, No. 10, Jul. 15, 2000, pp. 1697-1707.

Allan, R., "Single-Electron MOS Transistor Holds Promise for a Tiny Memory Cell," *Electronic Design*, Apr. 1, 1997, 3 pages.

Barraud, A., "Supermolecular Engineering by the Langmuir-Blodgett Method," *Thin Solid Films*, © Elsevier-Sequoia, 1989, vol. 175, pp. 73-80.

Ruaudel-Teixier, A. et al., "Spin Transition in a Magnetic Langmuir-Blodgett Film," *Thin Solid Films*, © Elsevier-Sequoia, 1988, pp. 107-115.

Ushijima, H. et al., "Magnetic, Optical, and Electrochemical Properties of Spin Transition Metal Complexes," *Synthetic Metals*, © Elsevier Science, 1999, vol. 103, pp. 2675-2678.

Kawakami, H. et al., "Electrical Bistable Behaviors of Organic Materials in a Single -Layer Structure," *Proceedings of SPIE*, 2003, vol. 5217, pp. 71-79.

\* cited by examiner

MOLECULAR MEMORY AND METHOD FOR MAKING SAME

RELATED APPLICATION

This is a §371 of International Application No. PCT/FR02/02961, with an international filing date of Aug. 29, 2002 (WO 03/019695, published Mar. 6, 2003), which is based on French Patent Application No. 01/11328, filed Aug. 31, 2001.

FIELD OF THE INVENTION

This invention pertains to the field of microelectronics, especially the manufacture of a set of condensers of micrometric or nanometric size for molecular memories or memories based on molecular aggregates.

BACKGROUND

The memories used at present are semiconductor memories which use magnetic or electric fields to write the information. However, they have a certain instability and a fortiori are sensitive to disturbances such as an ambient magnetic field or electric field. Moreover, the memory capacity remains relatively limited because of the size of these memories. It would therefore be advantageous to resolve these drawbacks by providing a memory constituted of condensers of micrometric or nanometric size to perform information storage at the molecular scale.

SUMMARY OF THE INVENTION

This invention relates to a molecular memory including a substrate made of silicon, a set of condensers, each condenser including two conductive layers constituting armatures of the condensers and between which is placed a dielectric layer, and a connector to provide electric contacts with external circuits, wherein the dielectric layer includes at least partially a polymer containing triazole derivatives, a spin transition phenomenon support material or a spin transition molecular complex.

This invention also relates to a method for manufacturing a molecular memory including covering a substrate with a conductive layer, coating a dielectric material on the conductive layer, covering the dielectric material with the conductive layer impregnating by immersion of a buffer in an inking solution of hexadecanethiol, drying and washing the impregnated buffer, creating a protective monolayer on the conductive layer by application of the impregnated, dried and washed buffer, and creating a chemical etching on the sample.

BRIEF DESCRIPTION OF THE DRAWINGS

Better understanding of the invention will be obtained from the description below, presented for purely explanatory purposes, of an embodiment of the invention with reference to the attached figures.

DETAILED DESCRIPTION

Figure 1:
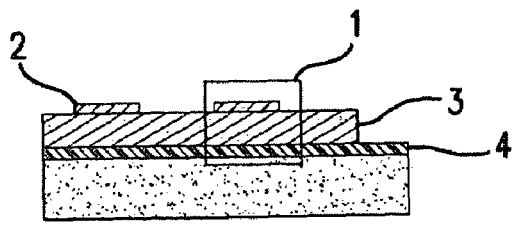
FIG. 1 is a sectional view of a condenser according to aspects of the invention.
Figure 2A:
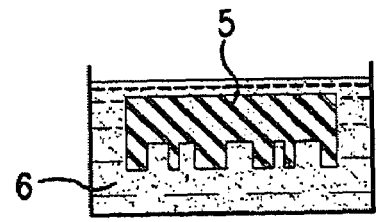
FIG. 2A-2D illustrate the steps of the method for the manufacturing of a set of condensers according to aspects of the invention.
Figure 2B:
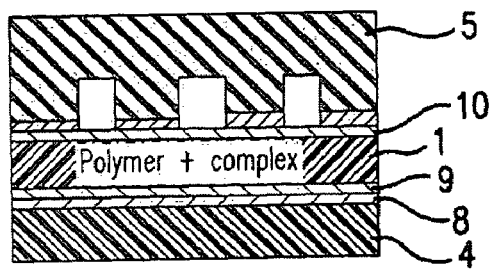
Figure 2C:
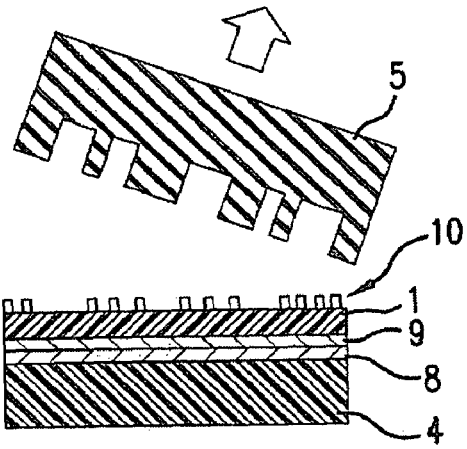
Figure 2D:
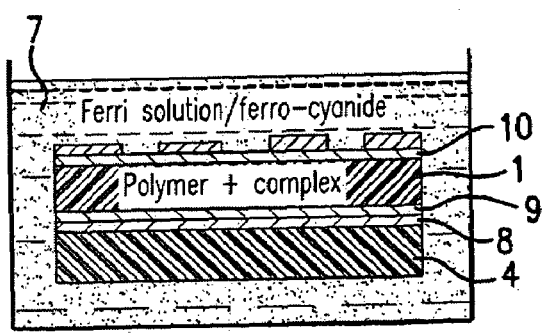

The memory of the invention is remarkable in its broadest sense in that the dielectric material is constituted at least partially of a polymer containing triazole derivatives, a spin transition complex or a support material of the spin transition phenomenon. The dielectric material is preferably constituted at least partially of the compound $(Fe(NH_2trz)_3)(NO_3)_2$, the compound $(Fe(Htrz)_2(trz))(NO_3)_2$ or the compound $(Fe(NH_2trz)_3)(Br)_2$. The dielectric material is advantageously constituted at least partially an alloy of ligands or anions, such as, for example, the compound $(Fe)Htrz_{3-3x}(NH_2trz)_{3x}(ClO_4) \cdot H_2O$ or the compound $(Fe(NH_2trz)_3)(NO_3)_{1.7}(BF_4)_{0.4}$.

According to a first embodiment, the dielectric material is constituted of a polymer mixture containing triazole derivatives with another polymer in acetonitrile. The mixture in acetonitrile is advantageously constituted of 40% of the polymer containing the triazole derivatives and 60% of polyvinyl acetate.

According to a second embodiment, the dielectric material is constituted of a mixture either of the spin transition complex with another polymer in the solvent of the spin transition complex or the spin transition phenomenon support material with another polymer in the solvent of the material.

In this manner, the spin coating of the polymer containing the triazole derivative, the spin transition complex or the spin transition phenomenon support material is facilitated.

The armatures are advantageously made of gold.

The invention also pertains to a method for manufacturing a molecular memory comprising, successively, a step of covering the substrate (4) with the conductive layer (9), a step of coating the dielectric material (1) on the conductive layer (9) and a step of covering the dielectric material (1) with the conductive layer (10), characterized in that the method furthermore comprises the following steps:

a) impregnation by immersion of a buffer in an inking solution of hexadecanethiol;

b) drying and washing of the impregnated buffer;

c) creation of a protective monolayer on one of the conductive layers by application of the impregnated, dried and washed buffer;

d) creation of a chemical etching on the sample obtained after step c).

The solution which has a molar concentration comprised between $0.01 \text{ mol} \cdot L^{-1}$ and $0.1 \text{ mol} \cdot L^{-1}$ is preferably brought to a temperature between 30° C. and 50° C. to enable the solubilization of the thiols contained in the inking solution. The chemical etching advantageously takes place in an aqueous medium at ambient temperature to not deteriorate the complex and the polymer. The buffer is advantageously transparent and of the polydimethylsiloxane type.

This manufacturing method makes it possible to form the molecular memory without altering the polymer containing the triazole derivatives, the spin transition complex or the spin transition phenomenon support material constituting at least partially the dielectric material (no oxidation, no dissolution, etc.). This method also enables alignment of the motifs on multiple levels for the manufacture of complex memory components.

The invention also pertains to a method of memory storage and information reading performed by means of a molecular memory, wherein the memory storage and information reading are based on the hysteretic variations in the capacity and the conductivity of the dielectric material.

Referring now to the drawings generally, the condenser of micrometric or nanometric size according to the invention, as illustrated in FIG. 1, is of the flat condenser type constituted of two conductive armatures (2, 3). There is a bottom armature (3) and a top armature (2), between which is located a dielectric material (1). The bottom armature (3) of the condenser rests on a substrate (4), preferably made of silicon. In a preferred embodiment, the armatures (2, 3) are made of gold.

The dielectric material (1) is constituted at least partially of a polymer containing triazole derivatives. This complex is mixed with a polymer of the polyvinyl acetate type in acetonitrile, to facilitate the spin coating of the complex.

In a preferred embodiment, the dielectric material (1) is obtained by mixing in acetonitrile 40% of the complex with 60% of polyvinyl acetate.

In a first embodiment of the invention, the dielectric material is constituted of the compound $(Fe(NH_2trz)_3)(NO_3)_2$. In a second embodiment of the invention, the dielectric material is constituted of the compound $(Fe(Htrz)_2(trz))(NO_3)$. In a third embodiment of the invention, the dielectric material is constituted of the compound $(Fe(NH_2trz)_3)(Br)_2$. In a further embodiment of the invention, the dielectric material is constituted of an alloy of ligands or anions such as, e.g., the compounds $Fe(Htrz)_{3-3x}$ $(NH_2trz)_3)(ClO_4) \cdot H_2O$ or $(Fe(NH_2trz)_3)(NO_3)_{1.7}(BF_4)_{0.4}$. The dielectric material (1) can also be constituted at least partially of a spin transition complex, which is mixed in the synthesis solvent of the complex. This invention extends to the use of any spin transition phenomenon support material.

FIG. 2 illustrates the different steps relative to manufacturing a molecular memory constituted of a set of condensers according to the invention.

According to one embodiment, the substrate (4) made of silicon, having a thickness of 500 μm, is covered by an adhesion layer of titanium (8) of a thickness of 50 nm, then a layer of gold (9) of a thickness of 50 nm, the layer of gold (9) having the bottom armature (3). The layer of gold (9) is then coated with the complex/polymer mixture constituting the dielectric material (1), the complex being either a polymer containing the triazole derivatives, or a spin transition molecular complex or a spin transition phenomenon support material. The dielectric material (1) is then covered with a layer of gold (10) of a thickness of 50 nm. The manufacture of the top armatures (2) of each of the condensers is then conducted via a protection by micro/nanobuffering of an inking solution (6) composed of thiols in absolute ethanol (hexadecanethiol).

An elastomer buffer (5) prepared from an initial mold fabricated by conventional microelectronic methods (optical lithography and ionic etching or electronic lithography and ionic etching for the micrometric or electronic lithography motifs and ionic etching for the nanometric motifs) is impregnated by immersion in the inking solution (6) having a concentration of $0.1$ mol·L$^{-1}$. The inking solution (6) is brought to a temperature comprised between 30° C. and 50° C. to enable the solubilization of the thiols.

The buffer (5) is applied on the layer of gold (10) after the operations of drying and washing the surface of the buffer (5) with absolute ethanol at a temperature of 60° C. to dissolve the possible crystals that could form after the drying operation. Thus, there are deposited $0.1$ mol L$^{-1}$ of molecular ink in the zones of contact between the buffer (5) and the gold layer (10), thereby forming a molecular layer which can be very dense, auto-assembled, monomolecular. For this mechanism, the motifs initially inscribed on the mold are replicated on the layer of gold (10).

The gold layer (10) is then subjected to a chemical etching to reveal the motifs formed by the thiol monolayers. The previously obtained substrates are plunged at ambient temperature into an aqueous medium (7) of the ferri/ferrocyanide type solution. The reaction takes place at a pH of 12 to avoid any risk of formation of HCN and prevent precipitation of the silicates stemming from the chemical etching of the surface of the substrate (4).

The elastomer used to constitute the buffer (5) is polydimethylsiloxane, which is also sold under the trade name of Sylgard 184. Because of its transparency, it makes possible the alignment of the motifs of the buffer (5) on the motifs preexisting on the sample. This makes possible the manufacture of complex devices requiring multiple levels of lithography.

Figure 3:
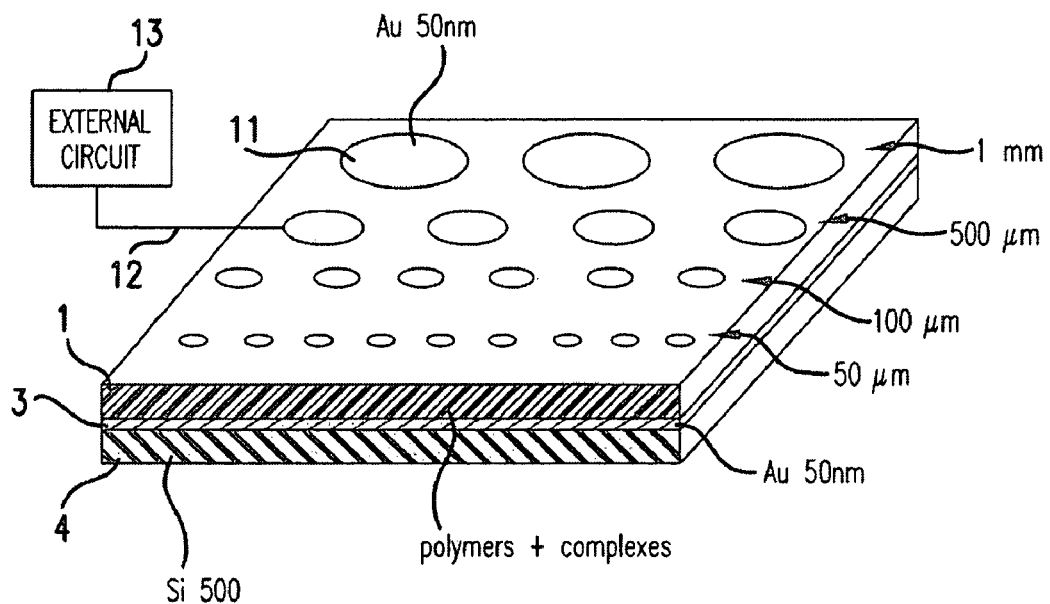
FIG. 3 is a perspective view of a memory component constituted of a set of condensers of difference sizes obtained according to the method described in FIG. 2.

FIG. 3 illustrates an example of fabrication of a memory component constituted of a set of condensers of different sizes obtained by implementation of the method described above. The component is constituted successively of a substrate (4), preferably made of silicon, a layer of gold (9) constituting the bottom armature (3) of the condensers, a dielectric material (1) constituted at least partially of a polymer containing triazole derivatives, a spin transition molecular complex or a spin transition phenomenon support material, and gold discs (11) of different sizes, each constituting the top armature (2) of a condenser. The exterior surface of at least one of the top armatures (2) is connected by a connection wire (12) to a connection terminal placed on a free part of the substrate (4) to provide electric contacts with the external circuits (13) (not represented in FIG. 3).

The molecular component can also be constituted of a set of flat condensers, with each condenser comprising two armatures of the electrode type of micrometric or nanometric size, between which is arranged the dielectric material support of spin transition. The electrodes of the condensers constituting such a molecular component are manufactured by the previously described buffering method or by any other nanolithography means. The horizontal architecture of the condensers has numerous advantages, especially in terms of addressing and density of integration. Furthermore, the storage of information and the reading of information can be based not solely on the hysteretic variations in the capacity, but also on the hysteretic variations in the conductivity of the electric medium.

Figure 4:
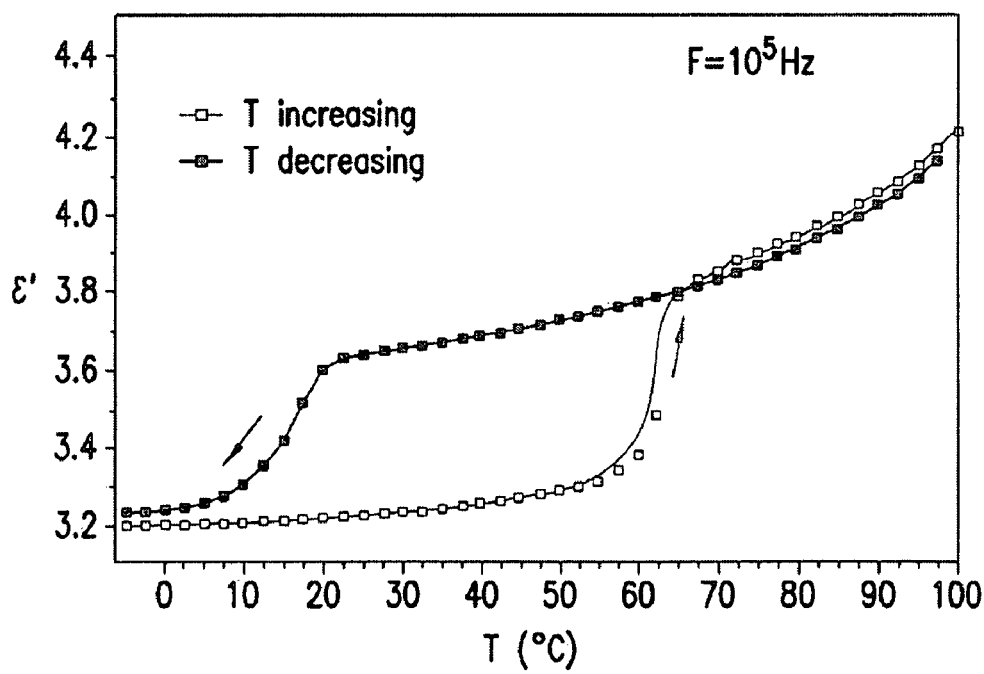
FIG. 4 is a graph of a hysteresis cycle of the dielectric constant measured in a spin transition complex.

FIG. 4 illustrates in an explanatory manner the performance of the dielectric constant measures in the compound $(Fe(NH_2trz)_3)(NO_3)_2$ as a function of temperature.

The invention is described above as an example. It is understood that one skilled in the art can implement different variations of the invention without going beyond the scope of the invention.

The invention claimed is:

1. A molecular memory comprising:
   a substrate comprising silicon;
   a set of condensers of micrometric or nanormetric size, each condenser comprising two conductive layers constituting armatures of the condensers and between which is placed a spin transition dielectric layer exhibiting thermally induced hysteresis of the dielectric constant; and
   a connector to provide electric contacts with external circuits,
   wherein the dielectric layer comprises a polymer containing triazole derivatives, a spin transition phenomenon support material or a spin transition molecular complex.

2. The molecular memory according to claim 1, wherein the dielectric layer comprises the compound $(Fe(NH_2trz)_3)(NO_3)_2$.

3. The molecular memory according to claim 1, wherein the dielectric layer comprises the compound $(Fe(Htrz)_2)(trz))(NO_3)_2$.

4. The molecular memory according to claim 1, wherein the dielectric layer comprises the compound $(Fe(NH_2trz)_3)(Br)_2$.

5. The molecular memory according to claim 1, wherein the armatures are made of gold.

6. The molecular memory according to claim 1, wherein the dielectric layer comprises a mixture of the polymer containing triazole derivatives, of the spin transition complex or the spin transition phenomenon support material with another-polymer.

7. The molecular memory according to claim 6, wherein the dielectric layer is a mixture of the spin transition complex with the polymer in the solvent of the spin transition complex, or the mixture of the spin transition phenomenon support material with the polymer in the solvent of the layer.

8. The molecular memory according to claim 1, wherein the dielectric layer comprises an alloy of ligands or anions.

9. The molecular memory according to claim 8, wherein the dielectric layer comprises $(Fe(Htrz)_{3-3x}(NH_2trz)_{3x})(ClO_4) \cdot H_2O$ or $(Fe(NH_2trz)_3)(NO_3)_{1.7}(BF_4)_{0.4}$.

10. The molecular memory according to claim 8, wherein the dielectric layer comprises $(Fe(NH_2trz)_3)(NO_3)_{1.7}(BF_4)_{0.4}$.

11. A molecular memory comprising:
a substrate comprising silicon;
a set of condensers of micrometric or nanometric size, each condenser comprising two conductive layers constituting armatures of the condensers and between which is placed a spin transition dielectric layer exhibiting hysteresis of the dielectric constant; and
a connector to provide electrical contacts with external circuits; wherein the dielectric layer comprises a mixture of a first polymer containing triazole derivatives, a spin transition complex or a spin transition phenomenon support material, and a second polymer containing polyvinyl acetate such that the ratio by mass of the triazole derivative to the polyvinyl acetatein the dielectric layer is 2:3.

12. A method for manufacturing a molecular memory comprising:
providing a substrate comprising silicon;
providing a spin transition dielectric layer exhibiting hysteresis of the dielectric constant, wherein the dielectric layer comprises a polymer containing triazole derivatives, a spin transition phenomenon support material, or a spin transition molecular complex;
covering the substrate with a first conductive layer;
coating the dielectric layer on the first conductive layer;
covering the dielectric material with a second conductive layer;
impregnating a buffet by immersion in an inking solution comprising hexadecanethiol;
drying and washing the impregnated buffer;
creating a protective monolayer on the second conductive layer by application of the impregnated, dried and washed buffer; and
creating a chemical etching on the resulting sample.

13. The method according to claim 12, wherein the inking solution has a molar concentration of hexadecanethiol between 0.01 mol $L^{31\ 1}$ and 0.1 mol $L_{31\ 1}$.

14. The method according to claim 12, wherein the inking solution is brought to a temperature between 30° C. and 50° C.

15. The method according to claim 12, wherein the chemical etching takes place in an aqueous medium at ambient temperature.

16. The method according to claim 12, wherein the buffer is transparent.

17. The method according to claim 16, wherein the buffer is polydimethylsiloxane.

18. A molecular memory comprising:
a substrate comprising silicon;
a first condenser of micrometric or nanometric size comprising two conductive layers constituting armatures of the condenser and between which is placed a spin transsition dielectric layer exhibiting thermally induced hysteresis of the dielectric constant and having a first dielectric constant value;
a second condenser of micrometric or nanometric size comprising two conductive layers constituting armatures of the condenser and between which is placed a spin transistion dielectric layer exhibiting thermally induced hysteresis of the dielectric constant and having a second dielectric constant value; and
a connector to provide electric contacts with external circuits,
wherein the dielectric layers comprise a polymer containing triazole derivatives, a spin transition phenomenon support material or a spin transition molecular complex.

* * * * *